United States Patent
Shih et al.

[19]

[11] Patent Number: 5,923,996
[45] Date of Patent: Jul. 13, 1999

[54] METHOD TO PROTECT ALIGNMENT MARK IN CMP PROCESS

[75] Inventors: Tsu Shih, Chunwang; Jui-Yu Chang, Yang-May; Syun-Ming Jang; Chen-Hua Yu, both of Hsin-Chu, all of Taiwan

[73] Assignee: Taiwan Semiconductor Manufacturing Company, Ltd, Hsin-Chu, Taiwan

[21] Appl. No.: 08/867,312

[22] Filed: Jun. 2, 1997

[51] Int. Cl.$^6$ .......... H01L 21/46; H01L 21/301; H01L 21/78

[52] U.S. Cl. .......... 438/462; 438/460; 438/108; 438/124

[58] Field of Search .................. 438/460, 108, 438/124

[56] References Cited

U.S. PATENT DOCUMENTS

| | | | |
|---|---|---|---|
| 4,981,529 | 1/1991 | Tsujita | 148/33 |
| 5,198,390 | 3/1993 | MacDonald et al. | 438/52 |
| 5,234,868 | 8/1993 | Cote | 438/18 |
| 5,314,843 | 5/1994 | Yu et al. | 437/225 |
| 5,401,691 | 3/1995 | Caldwell | 437/228 |
| 5,523,254 | 6/1996 | Satoh et al. | 437/62 |
| 5,556,808 | 9/1996 | Williams et al. | 438/106 |
| 5,622,899 | 4/1997 | Chao et al. | 438/462 |
| 5,668,042 | 9/1997 | Bae | 438/18 |
| 5,700,732 | 12/1997 | Jost et al. | 438/462 |
| 5,786,260 | 7/1998 | Jang et al. | |
| 5,801,090 | 9/1998 | Wu et al. | |

*Primary Examiner*—Kevin M. Picardat
*Assistant Examiner*—Devon Collins
*Attorney, Agent, or Firm*—George O. Saile; Stephen B. Ackerman

[57] ABSTRACT

A method is disclosed for forming alignment marks at the outer perimeter of wafers where they are not susceptible to much damage during chemical-mechanical polishing (CMP) process. Complete protection is provided by recessing the alignment mark into the substrate by etching. Recess etching is accomplished at the same time the isolation trenches are followed to delineate device areas. Thus, alignment marks are provided with a protective recess without extra steps. Furthermore, by forming alignment marks at the outer perimeter of the wafer, productivity is improved by providing maximum usage of wafer area for integrated circuits.

12 Claims, 12 Drawing Sheets

METHOD TO PROTECT ALIGNMENT MARK IN CMP PROCESS

RELATED PATENT

U.S. patent application Docket No: TSMC96-200, Ser. No. 08/891,088 filed Jul. 10, 1997 by the same inventors S. M. Jang, et al., "Method for Photo Alignment After CMP Planarization" assigned to common assignee.

BACKGROUND OF THE INVENTION (1) Field of the Invention

The present invention relates generally to alignment process in semiconductor manufacturing, and more particularly to protecting alignment marks from the abrasive effects of CMP planarization.

(2) Description of the Related Art

Chemical-mechanical polishing, or CMP, is a commonly used process in the manufacture of semiconductor wafers. CMP involves chemically etching of a surface while also mechanically grinding or polishing it. Because wafers are fabricated by forming many layers of different materials one on top of another, it is important that each layer is extremely flat and smooth, that is planarized, before receiving another layer. It has been found that CMP is extremely well suited for planarizing whole or portions of wafers and it has become one of the most important techniques for planarizing layers in wafers. However, we have also found that while very useful in a particular process of planarizing wafers, CMP can complicate matters in other set of processes, such as in preserving the integrity of alignment marks that have already been formed on layers for the purposes of aligning one layer with respect to the next one. This is clearly understood when given the abrasive nature of chemical-mechanical polishing. Methods for overcoming these problems is disclosed later in this invention.

The nature of the problem cited above can be seen by noting that CMP is generally accomplished by polishing the surface of a wafer against a polishing pad wetted with a slurry comprised of three ingredients: an acidic or basic solvent, an abrasive, and a suspension fluid. The combined action of surface chemical reaction and mechanical polishing allows for a controlled, layer by layer removal of a desired material from the wafer surface, resulting in a preferential removal of protruding surface topography and a planarized wafer surface. Thus, if features such as alignment marks on the surface of a wafer are not properly designed and protected from the CMP action, then they can be damaged or destroyed. Recovery of damaged or lost alignment marks can be accomplished, but at a cost and with much complicated procedures as practiced in the prior art that is discussed below.

Alignment marks and the process of aligning alignment marks are key aspects of fabricating wafers and integrated circuit (IC) chips in the manufacture of semiconductor components. They are key because the chips themselves and the devices that go into making the chip components are fabricated by aligning many intricate layers of conductors and insulators, one upon the other, on a substrate, usually silicon. And, in the resulting structure, called the wafer, it is critical that each layer is precisely aligned with the previous layer so that the circuits formed therein are functional and reliable.

Typically, the alignment of one layer with respect to another is accomplished by means of a tool known as a wafer stepper. The wafer stepper is used to project optically a circuit pattern from a reticle mounted in the wafer stepper onto a layer formed on the semiconductor wafer. However, before the pattern on the reticle is transferred, the wafer must first be positioned or aligned precisely with respect to the reticle. Thus, a wafer ready to be patterned is loaded onto a wafer stepper. Then, using the alignment marks already on the wafer, the wafer is aligned in relation to the reticle. Once the alignment is accomplished, the remaining steps of projecting the pattern on to the semiconductor may proceed.

As is well known in the art, the position of the alignment mark on the wafer is commonly sensed by means of a laser beam. The laser beam in the stepper is bounced off of the alignment mark to create a slonal pattern of laser light. The detraction from the mark is reflected back to sending devices in the stepper and is used as a signal to measure the exact position of the alignment mark. It is to be noted that the sensed quality of the defractive light from the alignment mark is directly dependent upon the integrity of the structure of the alignment mark. The present invention is concerned with that integrity, that is, with the structure and dimensions of alignment marks, that determine how well the alignment of semiconductor wafers is accomplished.

In general, alignment marks that are formed in a wafer are subjected to the same and many process steps that the rest of the wafer experiences. The steps include deposition of conductors, insulators, etching of the same, polishing, grinding and so on. After and before each one of these steps, the alignment mark must preserve its exact dimensions and be visible to the observing beam, such as the laser beam, so that alignment of various layers with respect to the mark will always be precisely repeatable.

Figure 1A:
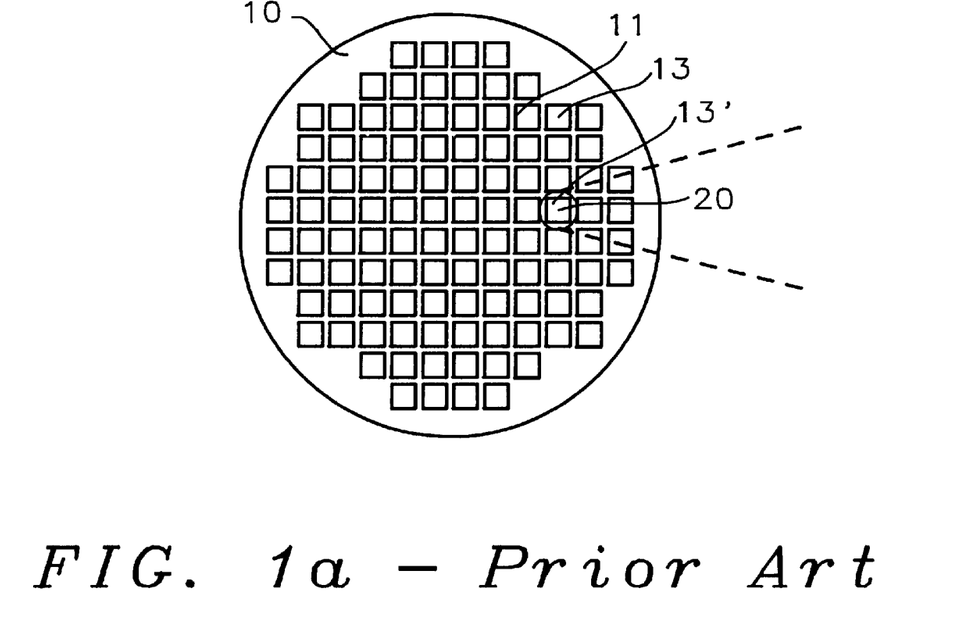
FIGS. 1a and 1b are plan views of a wafer and a blank site, respectively, showing chip sites and the conventional placement of alignment marks on the wafer.
Figure 1B:
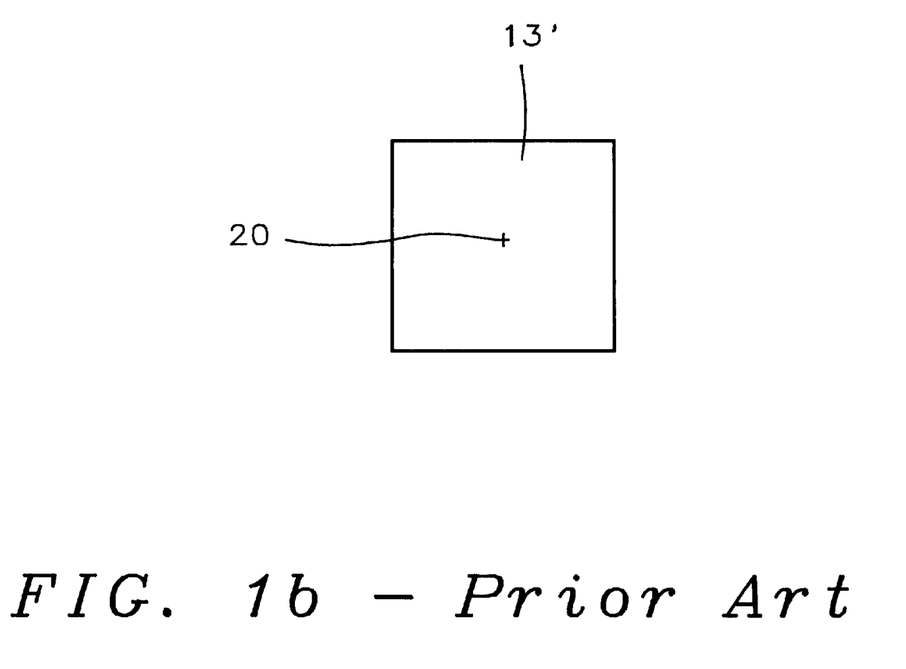

Alignment marks are usually of a simple geometrical shape such as a rectangle or a cross (20) as shown in FIG. 1b, and are commonly etched with a relatively shallow depth into the silicon substrate of wafer (10) shown in FIG. 1a. The position of the alignment mark is sensed by the beam as it traverses edge (21) of mark (20), better seen in the cross-sectional view in FIG. 2a. Therefore, the integrity of the edge dimension must be preserved throughout the various process steps of the wafer. The marks are formed into convenient areas on a wafer, such as a blank chip site (13') inside a kerf (11), that is, inside trench like lines shown in FIG. 1a that are scribed on a wafer around the perimeter of each chip site (13). The chips later on are broken off at the kerfs to separate them into individual components. When relatively thin and conformable materials such as oxides are deposited on a wafer, the alignment marks are also deposited with the material. However, because the deposited material is conformal, the exact shape and depth of the alignment mark is replicated. Consequently, the alignment beam can sense the exact step of the edge and hence the alignment mark. Even when the wafer is polished flat, as long as the material—such as the well-known interlevel dielectrics, ILD—is transparent to the beam, the alignment mark in the layer below can still be seen and recognized. There are times, however, when materials, such as conductor metals, that are opaque to the observing beam are deposited over polished flat ILDs. In that case, the alignment mark is hidden below the metal layer and cannot be reckoned by the alignment system. Methods for circumventing these kinds of situations must be found, and though there are a few such prior art methods, not all of them address some unique problems that arise in the manufacture of semiconductor wafers, as discussed later.

Figure 2A:
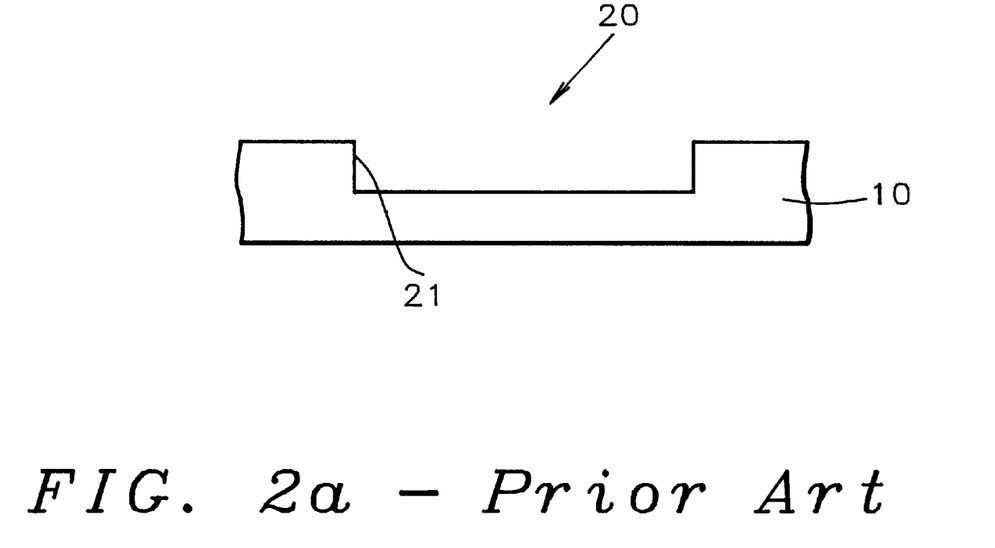
FIGS. 2a–2f are cross sectional views of a substrate showing the conventional forming and replication of an alignment mark.

In U.S. Pat. No. 5,401,691, Caldwell describes well some of the common problems encountered in prior art techniques of generating alignment marks and aligning wafers. Following his description, an alignment mark is generally formed by etching a predetermined depth into the semiconductor 10, as shown in FIG. 2a. The etching process forms a step height (21) in wafer (10). Step height (21) acts as the alignment mark and is usually chosen to be some multiple of the wavelength of the laser light used by the stepper to conduct alignment. As is pointed out in U.S. Pat. No. 5,401,691, by utilizing an alignment mark which is ¼ multiple of the laser wavelength, the signal to noise ration of the laser defraction is optimized, resulting in optimum alignment precision.

Figure 2B:
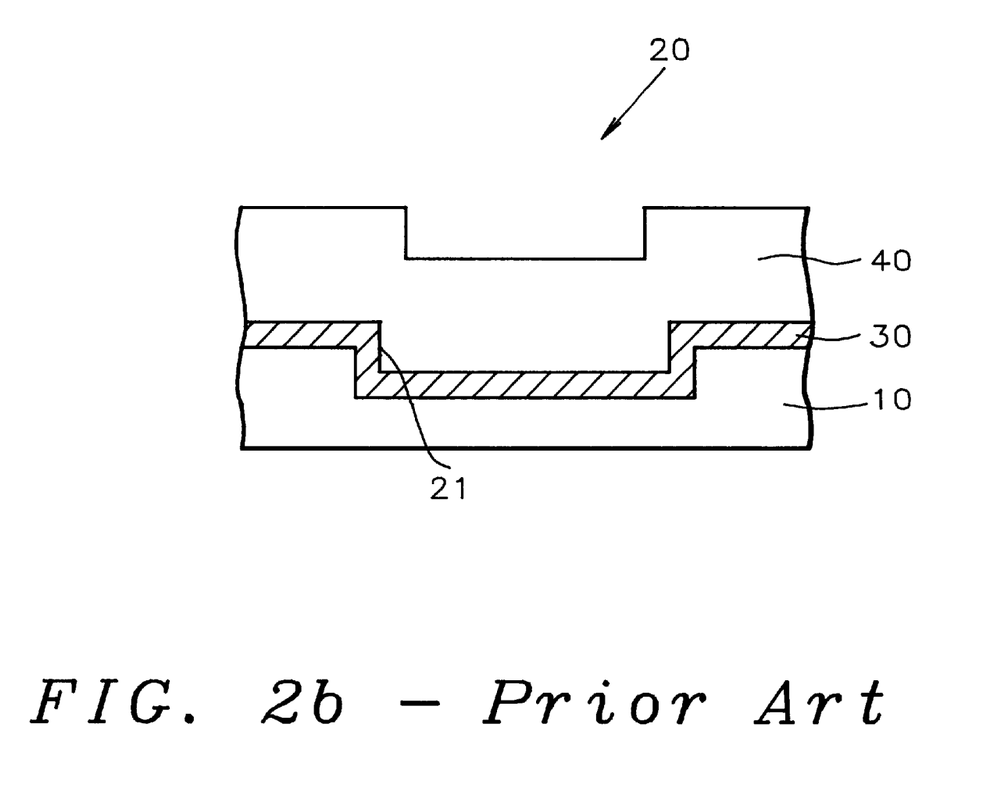

Next, the conventional steps of fabricating a semiconductor wafer are continued. Thus, subsequent layers used to form the integrated circuit are grown and deposited. For example, polysilicon conductor is deposited over the wafer as shown in FIG. 2b. This step usually follows the growing of field isolation regions (not shown) elsewhere on the wafer where IC devices are formed. The polysilicon layer is then covered with the deposition of an ILD layer (40). Although the original alignment mark (20) is covered by subsequent layers, the step height (21) and therefore, the alignment mark (20) is replicated in the subsequently deposited layers. The replicated alignment marks are used for aligning and patterning the subsequent layers. That is, as more layers are added to the IC, the step height of the alignment mark is propagated upward or is "built upward" with subsequent layers. The step height of the alignment mark is therefore preserved in subsequent layers so that alignment of subsequent layer can be accomplished.

Figure 2C:
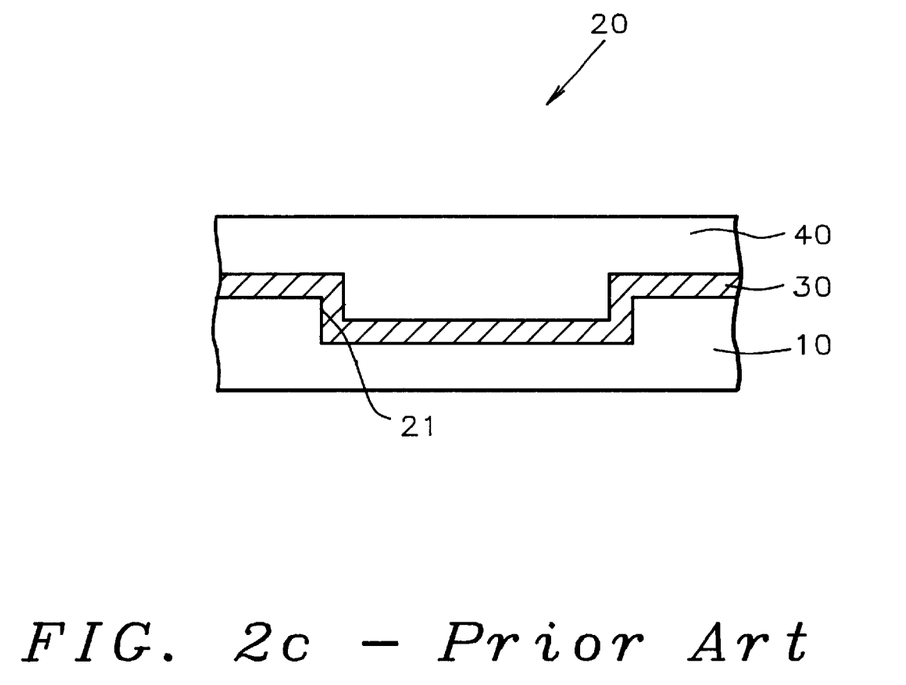

A problem that is well recognized with building up the alignment mark is its incompatibility with global planarization techniques, such as chemical-mechanical polishing (CMP). As more and more layers are added to the wafer manufacturing process, and circuit density increases, the requirement to planarize the wafer topography at intermediate steps in the process becomes essential. As is well known in the art, it is important to planarize surfaces of multilevel integrated circuits because nonplanar surfaces interfere with the optical resolution of subsequent photolithography processing steps. This makes it extremely difficult to print high resolution lines, as pointed out by Caldwell. Additionally, nonplanar surface topographies can effect subsequently formed metal layers. If a step height is too large, there is a serious danger that open circuits will be formed in later metal layers. It has been found in prior art that the best way to planarize the wafer topography is to planarize the ILDs and to use a global planarization technique, such as CMP. Global planarization techniques planarize the entire wafer surface and make the surface essentially flat. Unfortunately, when ILD (40) in FIG. 2b is globally planarized, ILD all over the wafer including that which is over the alignment mark (21) is also planarized. The global planarization technique, therefore, removes the alignment mark replicated in ILD (40), as shown in FIG. 2c.

Although the alignment mark has been removed during the global planarization step, the next process step, which is typically a contact etch step, can still proceed because the alignment mark (21) is visible through the transparent ILD (40). That is , the contact etch pattern step can be aligned to the step height formed in polysilicon layer (30).

Figure 2D:
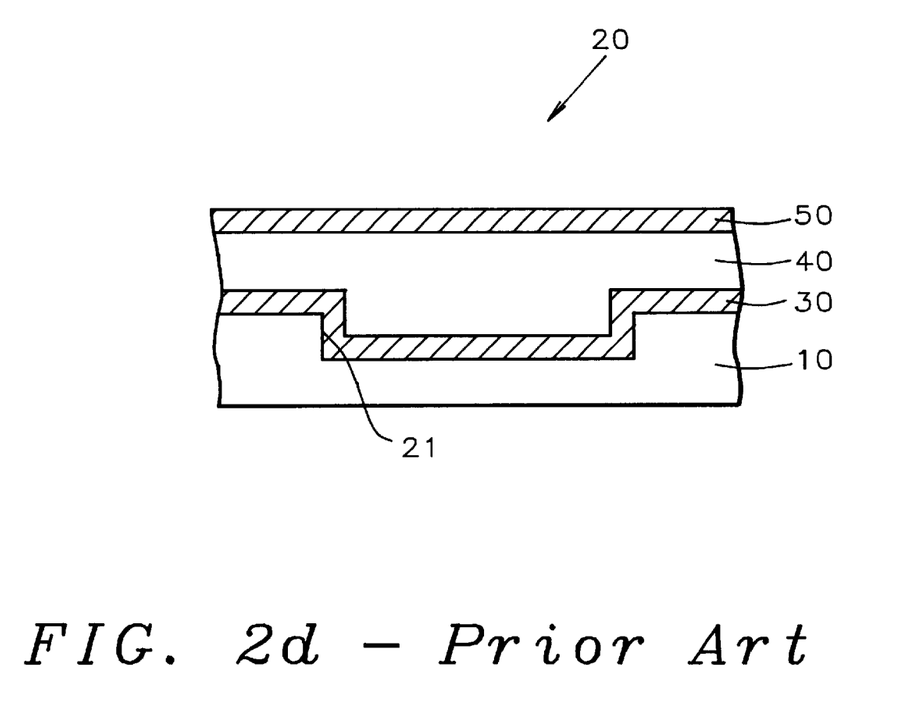

Following Caldwell, the next step in the fabrication of ICs typically is the formation of metal interconnects. As shown in FIG. 2d, a metal layer (50) is blanket deposited over ILD and into contact holes (not shown) in the wafer. Because metal layers are opaque, the step height (21) of alignment mark (20) formed in polysilicon layer (30) is invisible to the stepper laser. Without a visible alignment mark or an alignment mark replicated in metal layer (50), it is impossible to align the reticle to generate the metal interconnection pattern.

Figure 2E:
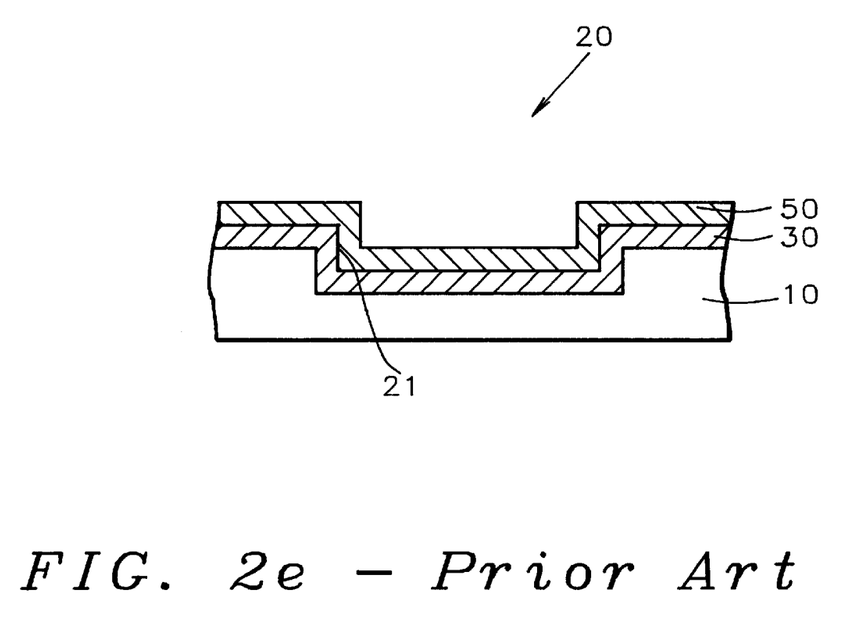

One solution to the planarized alignment mark problem is an "open frame" process as described by Caldwell. In an open frame process, after contact alignment, a separate reticle (an open frame reticle) is used to expose the area immediately surrounding alignment mark (20). ILD (40) over alignment mark (20) can then be etched away during the contact etch. Metal layer (50) can then be formed over uncovered alignment mark (20) formed in polysilicon layer (30), as shown in FIG. 2e. Alignment mark (20) recaptured and replicated in metal layer (50) can now be used to align the reticle to generate the metal interconnect pattern.

Figure 2F:
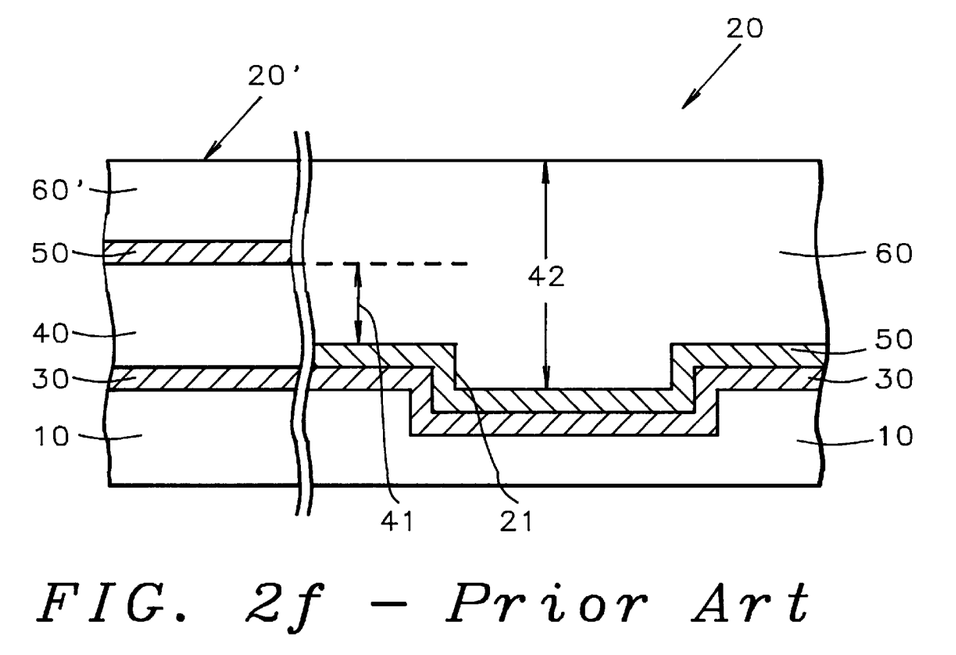

Because the ILD over the alignment mark (20) is removed during the contact etch step of the "open frame" process described above, it will be appreciated that the elevation of second metal (50) over the alignment mark area (20) will be lower than the elevation of the same second metal (50) extending to other IC areas (20') of wafer (10). The difference in the elevation between the alignment mark area (20) and other areas (20') is depicted with numeral (41) in FIG. 2f. Thus, as is seen in the same FIG. 2f, the ILD (40) that is present between metal layers (30) and (50) in other areas on the wafer is missing over the alignment mark area. When a next layer of ILD (60) is deposited and then globally planarized, in comparison with other areas (20') on the wafer, the total thickness (42) of the dielectric material over the alignment mark area (20) will be increased by the amount (41) that was etched during the first "open frame" process. If one were to use a second "open frame" process now to open the alignment mark (21) below, it is clear that the structures such as shown in areas (20') will not be able to withstand the additional etching required to reach down to the alignment mark (21) as shown in FIG. 2f. In other words, critical areas in other parts of the wafer would be overetched. Hence while "open frame" process is useful in recapturing an alignment mark the first time around, it is not compatible with global CMP when used subsequent times.

Just as lower elevation areas are created over alignment mark areas with the "open frame" process as described above on the one hand, higher elevation areas or "mesas", on the other hand, are created adjacent to alignment mark areas in the absence of "open frame" process. The latter process causing "mesas" will not be repeated here inasmuch as it is not necessary for the understanding of this invention. Suffice it to say that the high mesas at the edges of chip sites adjacent to the alignment mark areas slow down the polish rate of CMP causing yield losses. Caldwell circumvents the "elevation difference" problems of high "mesas" and "open frame" process by judiciously removing the ILD layers over the alignment mark areas and building upward the alignment mark with metal layers, while removing alternately the metal layers in the area immediately adjacent to the alignment mark areas. In this manner, it is possible to maintain ILD thicknesses relatively the same over the whole wafer after each chemical-mechanical polishing, thereby preventing the over etching of critical areas. At the same time, his methods also avoids the problems of high mesas. However, these methods that are disclosed in U.S. Pat. No. 5,401,691 are complex, and they require the use of several masking steps including open frame and inverse open frame reticles with the stepper. What is needed is a much less complicated process where masking steps for the alignment mark are eliminated as disclosed later in this invention.

U.S. Pat. No. 5,523,254 teaches a chemical-mechanical alignment mark where a second alignment mark is formed after a via etch nearby a first alignment mark. However, this method does not eliminate the need for masking steps for the alignment mark as disclosed in the present invention. In U.S.

Pat. No. 5,314,8423 Yu et al., discuss methods for modifying the CMP polishing rate of different portions and materials on a wafer so that the resultant surface would be better planarized with minimal depressions on the surface, or "dishing" effects. Nevertheless, areas for alignment marks are not addressed. On the other hand, U.S. Pat. No. 4,981,529 is concerned with the arrangement of alignment marks under a resist film, but no mention is made of the effects of chemical-mechanical polishing on the alignment marks. What is needed is a method for avoiding the detrimental effects of CMP on alignment marks on wafers.

SUMMARY OF THE INVENTION

It is therefore an object of this invention to provide a method of forming alignment marks on a semiconductor wafer.

It is another object of this invention to provide a method for recessing alignment marks into the substrate of a semiconductor wafer.

It is still another object of this invention to provide a method for protecting alignment marks from the abrasive effects of chemical-mechanical polishing.

It is yet another object of this invention to provide a structure comprising alignment marks.

In accordance with the aforementioned objects, there is provided a method for forming alignment marks at the outer perimeter surface of a substrate and then recessing the alignment marks into a trench at a predetermined depth in the substrate.

In accordance with the aforementioned objects, there is also provided a recess structure of a specific aspect ratio in which the alignment marks are protected from the abrasive effects of chemical-mechanical polishing.

BRIEF DESCRIPTION OF THE DRAWINGS

The objects and features of this invention will become apparent more readily from a reading of the description in conjunction with drawings wherein similar numerals refer to similar parts throughout the several views that follow.

DESCRIPTION OF THE PREFERRED EMBODIMENTS

Figure 3A:
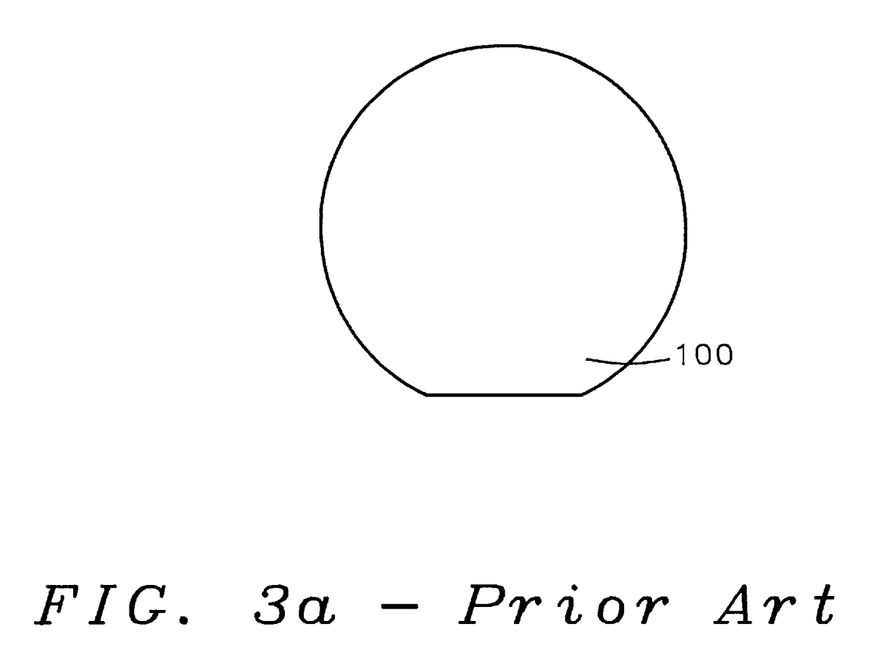
FIGS. 3a and 3b are schematic drawings showing conventional steps of forming alignment marks on a wafer.
Figure 3B:
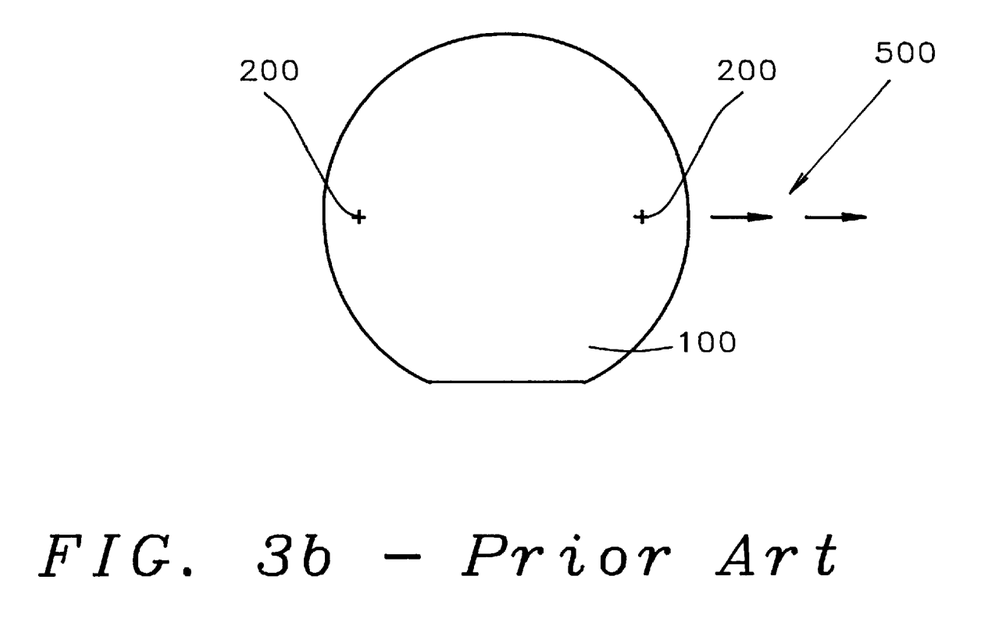
Figure 4A:
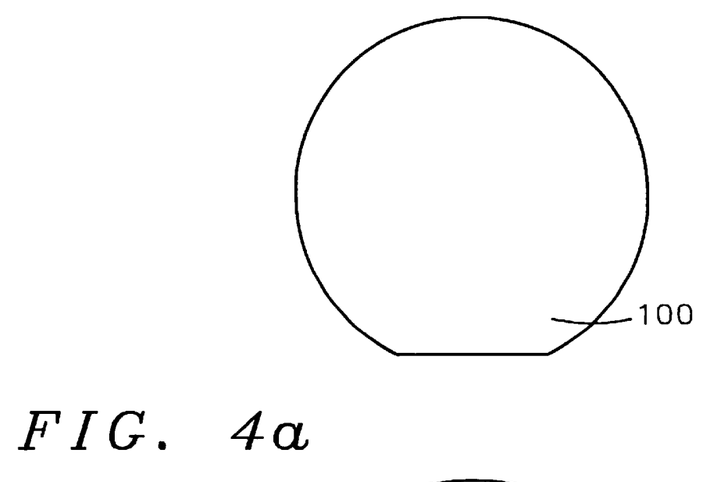
FIGS. 4a–4c are schematic drawings showing steps of forming recessed alignment marks on a wafer according to this invention.
Figure 4B:
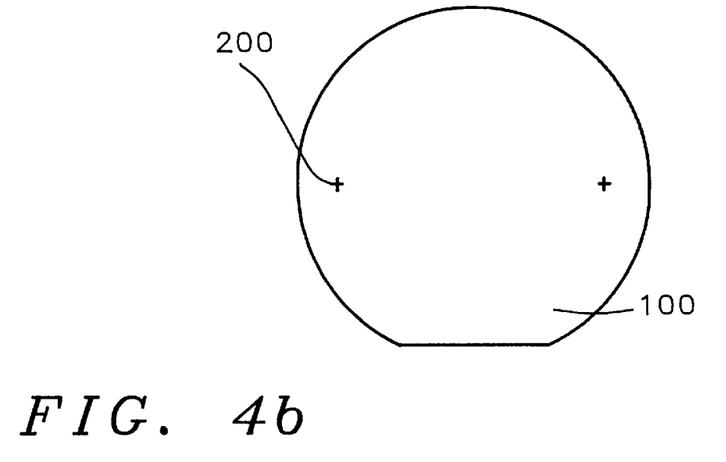
Figure 4C:
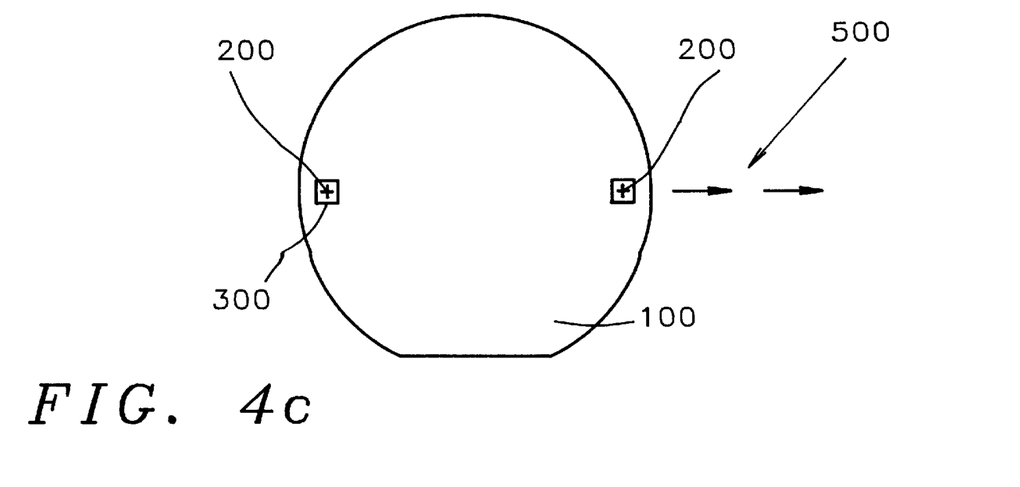

Referring now to the drawings, in particular to FIGS. 4a–4c, there are shown steps for forming alignment marks on a wafer. In the embodiment shown in FIG. 4b, alignment marks (200) are first formed in the peripheral areas of wafer (100) shown in FIG. 4a. It will be noted from FIGS. 3a and 3b that conventionally, alignment marks are placed in empty chip sites or in kerf areas where chips are separated after the manufacturing of semiconductor wafers. It is preferred in this invention to place the alignment marks in outer perimeter of the wafer in order to protect the alignment marks from the abrading effects of the chemical-mechanical polishing (CMP).

As explained above in related art, a wafer (100) that has been marked or formed with alignment marks (200) as shown in FIG. 3 is subjected to further semiconductor processing steps which are represented here schematically with numeral (500) in the same Figure. These include the deposition of various materials as well as the removal of the same through process means including, for example, chemical mechanical polishing (CMP) which can remove some or all of alignment marks as well. Consequently, in the partial or even total absence of the alignment marks, subsequent process steps are rendered difficult at best, or not possible at all.

The forming of alignment marks at the outer perimeter of the wafer is preferred because of the favorable polishing action of the CMP polishing pad (not shown). The wafer rotates against the pad while the pad is being held perpendicular to the plane of the wafer. It is found that the pad exerts most pressure centrally with respect to the wafer though the linear velocity of the pad is greatest towards the perimeter of the wafer. The pad has a less of a tendency to bear down on the perimeter of the wafer and cause what is known in the art as "dishing", that is, a dish like depression on the surface that it is being chemically etched and mechanically abraded. The preferred location of the alignment mark (200) is to exploit this characteristic of CMP action. An added advantage of placing the marks outside of the chip areas is to increase productivity at the wafer level by providing maximum usage of wafer area for integrated circuits.

In addition to placing the alignment marks at the outer perimeter of a wafer, it has been found that the damage caused to the alignment marks by the action of CMP can further be alleviated by recessing the alignment marks into a recess deep enough so as to prevent the abrasive action of CMP from reaching onto the alignment marks. This is accomplished by etching around the area of the alignment marks such that the mark pattern is transferred or propagated downward into a recess. A main feature and key aspect of this invention is that in addition to the low aspect ratio of the recess so formed, the recess is etched at the same time shallow trenches are etched for isolating devices that are later formed into the substrate. Process steps for forming isolation trenches are well known and will not be described in detail here in order not to unnecessarily obscure the present invention. It will be appreciated by those skilled in the art that the ability to form recesses for the purpose of protecting alignment marks without the need for added etching steps is a significant advantage.

Figure 5A:
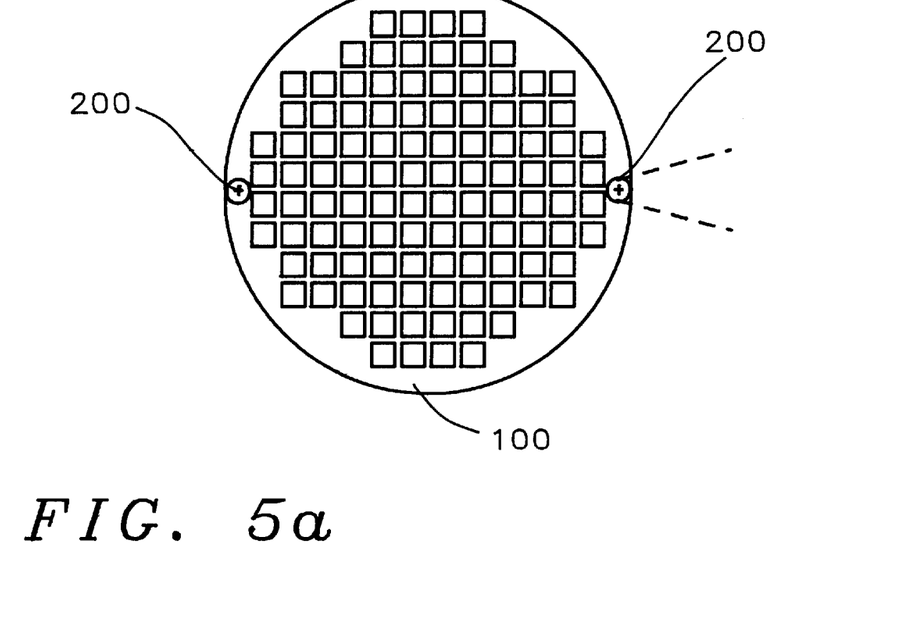
FIGS. 5a and 5b are plan views of a wafer and a peripheral site of a wafer, respectively, showing chip sites and the placement of alignment marks on the wafer according to this invention.
Figure 5B:
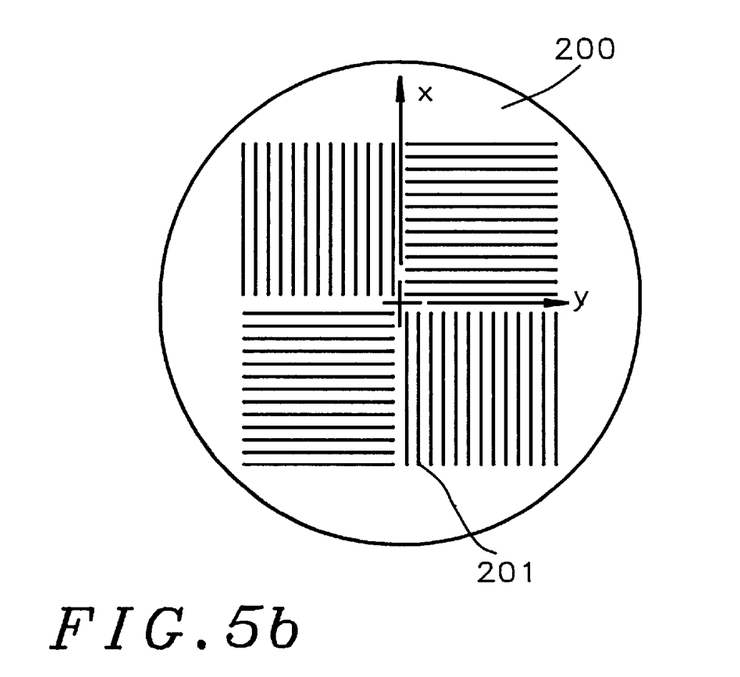

An enlarged view of alignment marks that are etched and propagated downwards into the substrate is shown in FIG. 5b. Mark (200) comprises a group of grooves (201) that are alternately oriented in the x and y directions as shown in FIG. 5b. Grooves are formed into the silicon substrate of wafer (10) by plasma etching to a depth between about 1,200 to 1,300 angstroms (A). They are preferably of width between about 7 to 8 $\mu$m, and length between about 170 to 180 $\mu$m. Thus in the first and third quadrants, a group of 13 lines are oriented in the x-direction, while a second group of 13 lines are oriented in the y-direction. In the preferred embodiment, two sets of periodicity are used in the spacing of the lines; namely, 8.0 micrometers ($\mu$) in the x-direction and 8.8 $\mu$ in the y-direction. Other arrangements, and other groups with different number of lines can also be used to form any desired type of alignment marks.

Figure 6A:
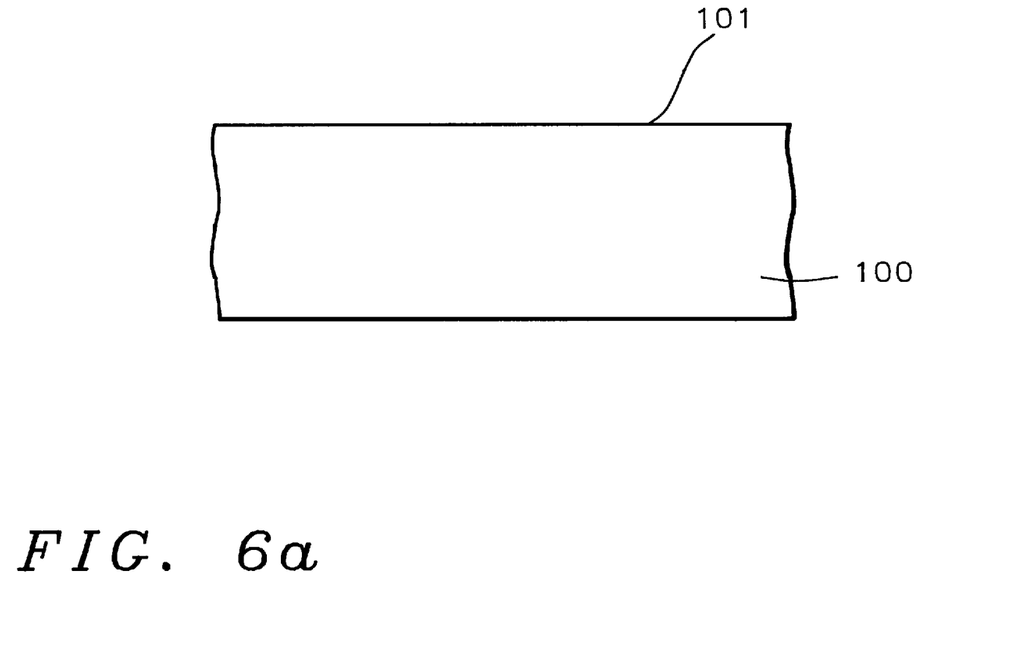
FIGS. 6a–6c are cross sectional views of a substrate showing the forming and abrasion of an alignment mark during chemical-mechanical polishing.
Figure 6B:
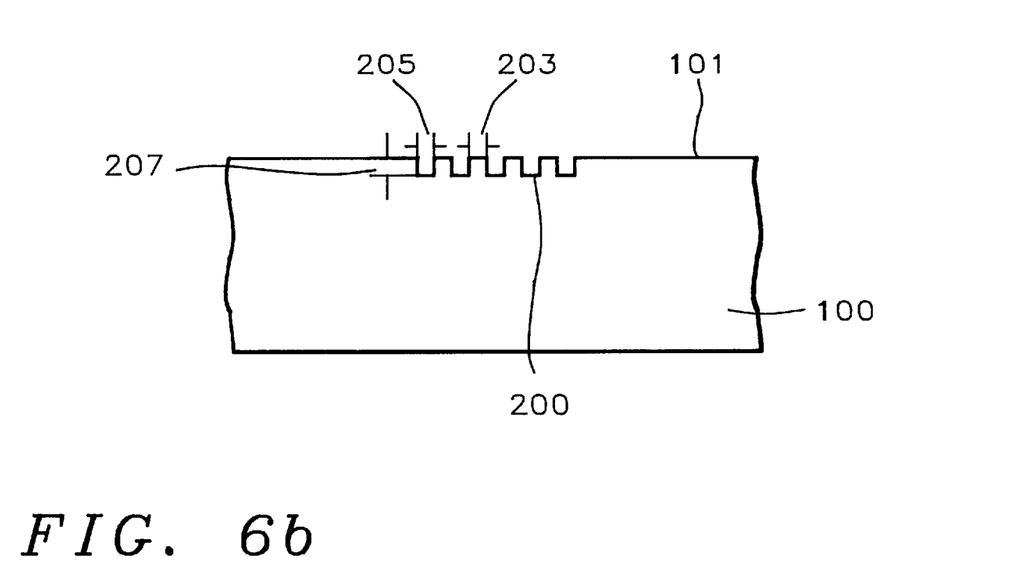
Figure 7A:
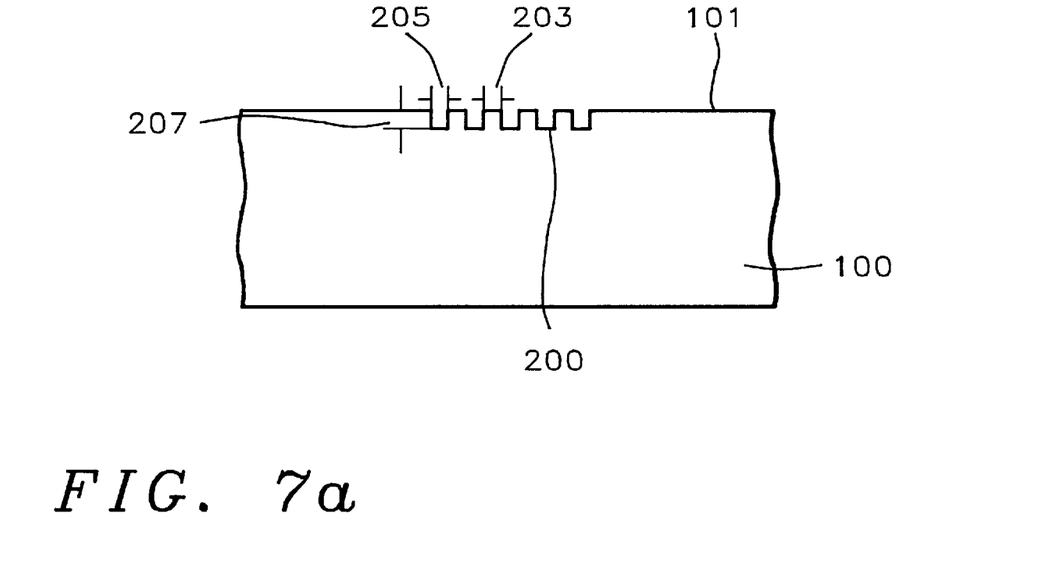
FIGS. 7a–7f are cross sectional views of a substrate showing the forming and then recessing of alignment marks into a substrate according to this invention.

FIGS. 6a and 7a show alignment marks (200) formed as described above on substrate (100). In the preferred mode shown in FIG. 7b, alignment marks of FIG. 7a are further etched—at the same time the isolation trenches are formed prior to the forming of device areas—in steps that the alignment mark pattern is propagated downward until a desired depth is reached. This is accomplished by performing anisotropic plasma dry etch with a recipe comprising a gas mixture such as containing fluorine and bromine, namely, $SF_6$ and HBr, in an environment with a pressure between about 25 to 35 mtorr at a power between about 270 and 280 watts.

Figure 6C:
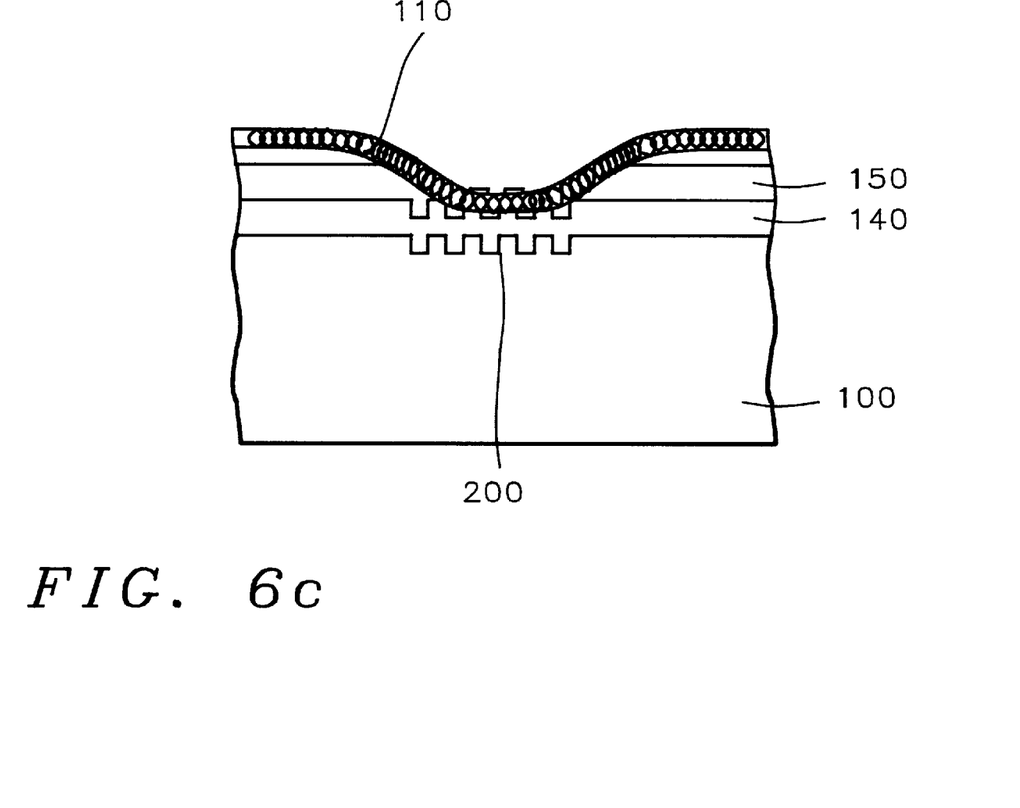

FIG. 6c depicts how alignment marks that are not recessed into substrate (100) can be damaged by the polishing action of CMP polishing pad (110). It has been observed in current practice that even when the alignment marks are formed in shallow areas that are etched into silicon substrate (100), the CMP pad can cause "dishing" as shown in FIG. 6c. Excessive dishing enables the pad to reach down and abrade the alignment marks. It will be apparent to those skilled in the art that the intermediate steps in arriving at the chemical-mechanical polishing step are not given here in order not to obscure the main point of the obliteration of alignment marks during CMP. The usual steps comprise the growing of oxide, depositing and patterning of polysilicon and the forming and polishing of the interlevel dielectric layer. In one particular experiment, tungsten was deposited and the CMP polished. The alignment marks were damaged and the next process step could not be carried out.

Figure 7B:
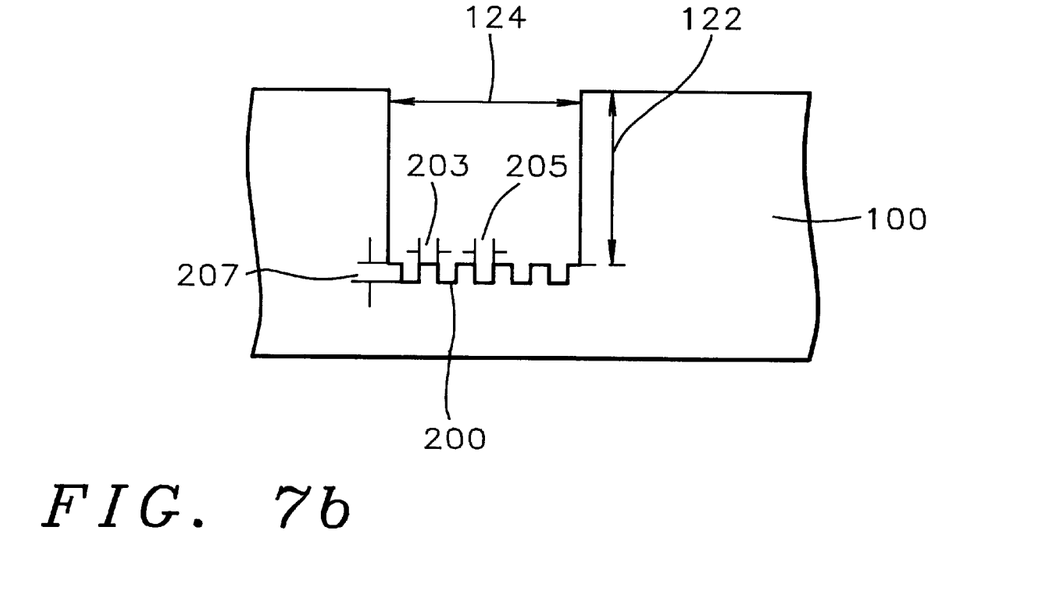

However, in the preferred embodiment of FIGS. 7a–7f, "dishing" is no longer a problem. A main feature and key spirit of the present invention is the narrow opening of recess (120) which prevents the CMP pad from reaching into the opening and destroying the alignment mark (200). It is preferred that the width (124) and depth (122) of the recess are, respectively, between about 450 to 1000 $\mu$m, and between about 1 to 10 $\mu$m yielding an aspect ratio between about 1/450 to 1/100. Alignment marks (200) are then formed at the bottom of the recess as shown in FIG. 7b. Any suitable set of geometrical marks can be employed although marks (200) embodied in FIG. 5b as specified above are preferred. Thus width (203) and depth (205) are, respectively, between about 7 to 8 $\mu$m and between about 0.12 to 0.13 $\mu$m.

Figure 7C:
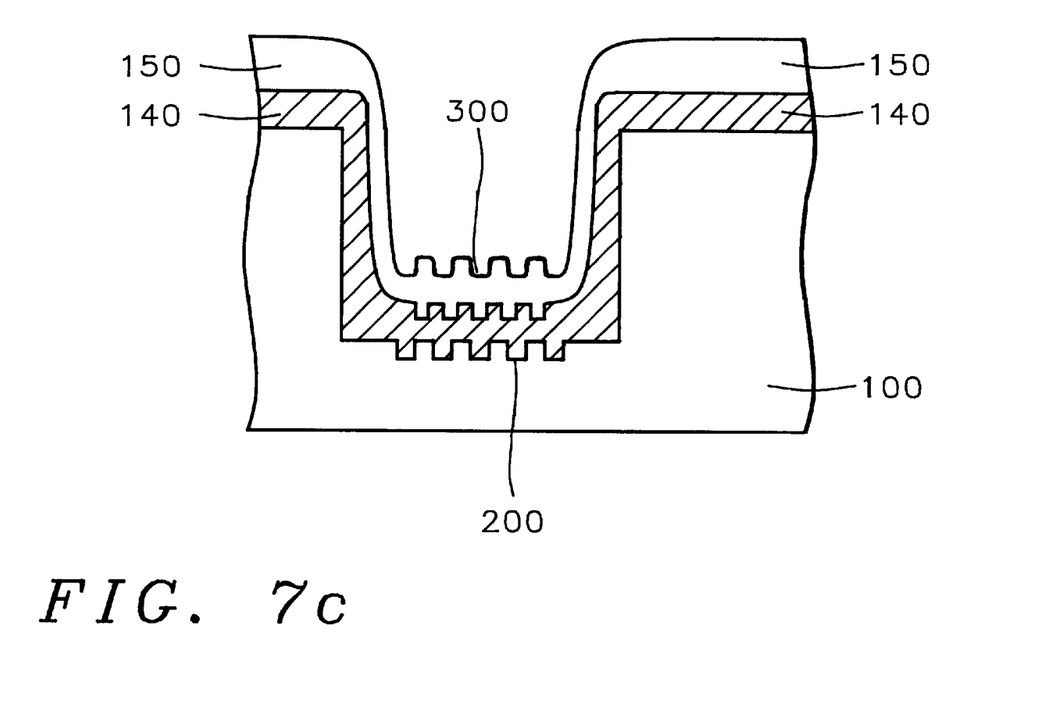
Figure 7D:
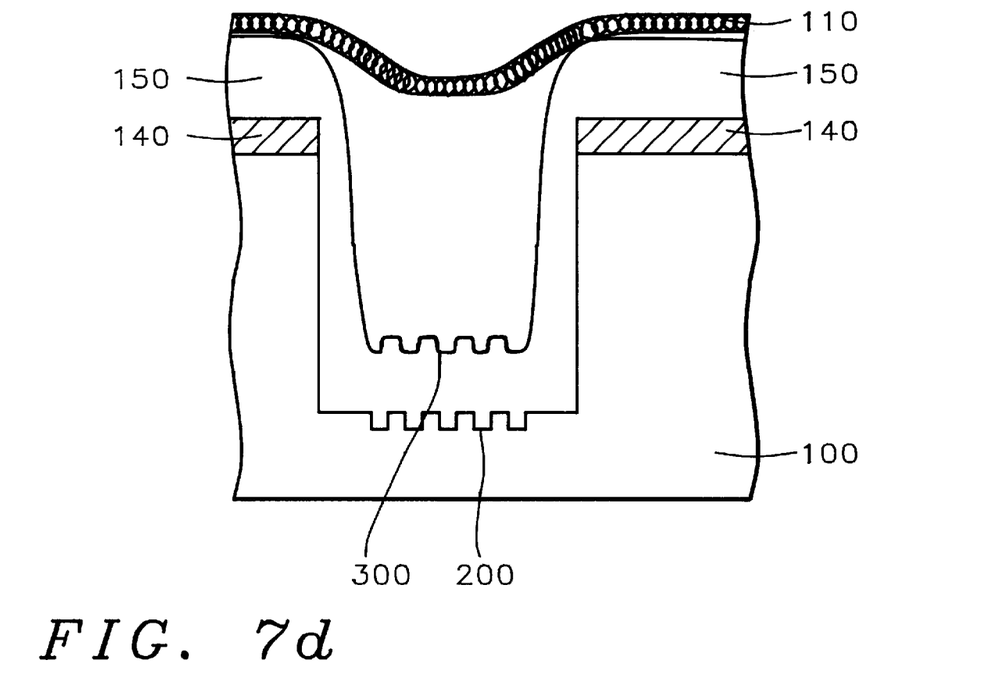
Figure 7E:
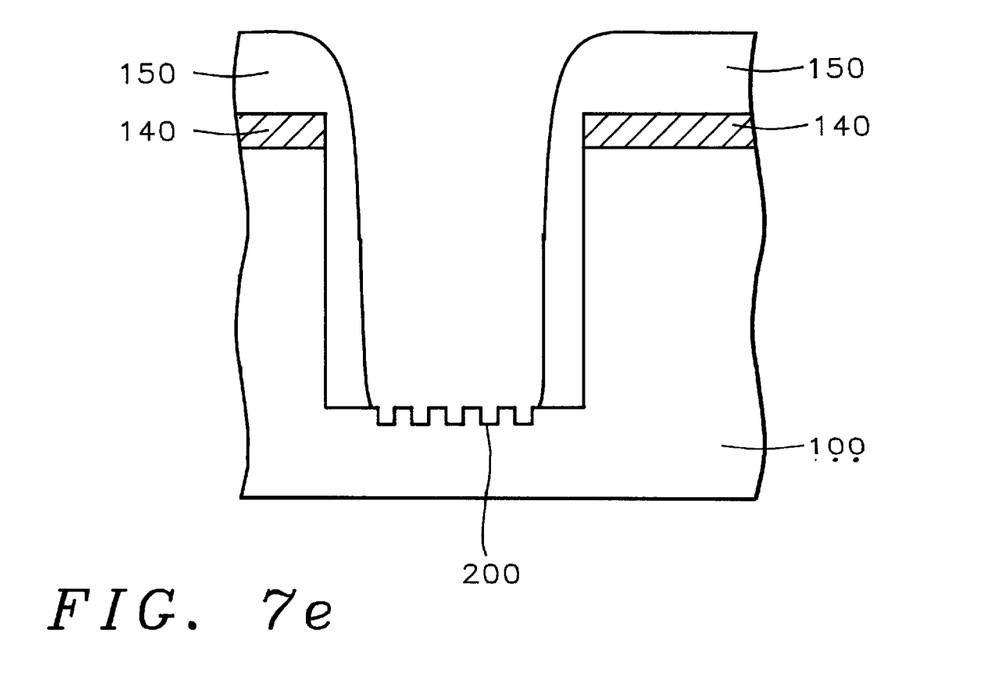
Figure 7F:
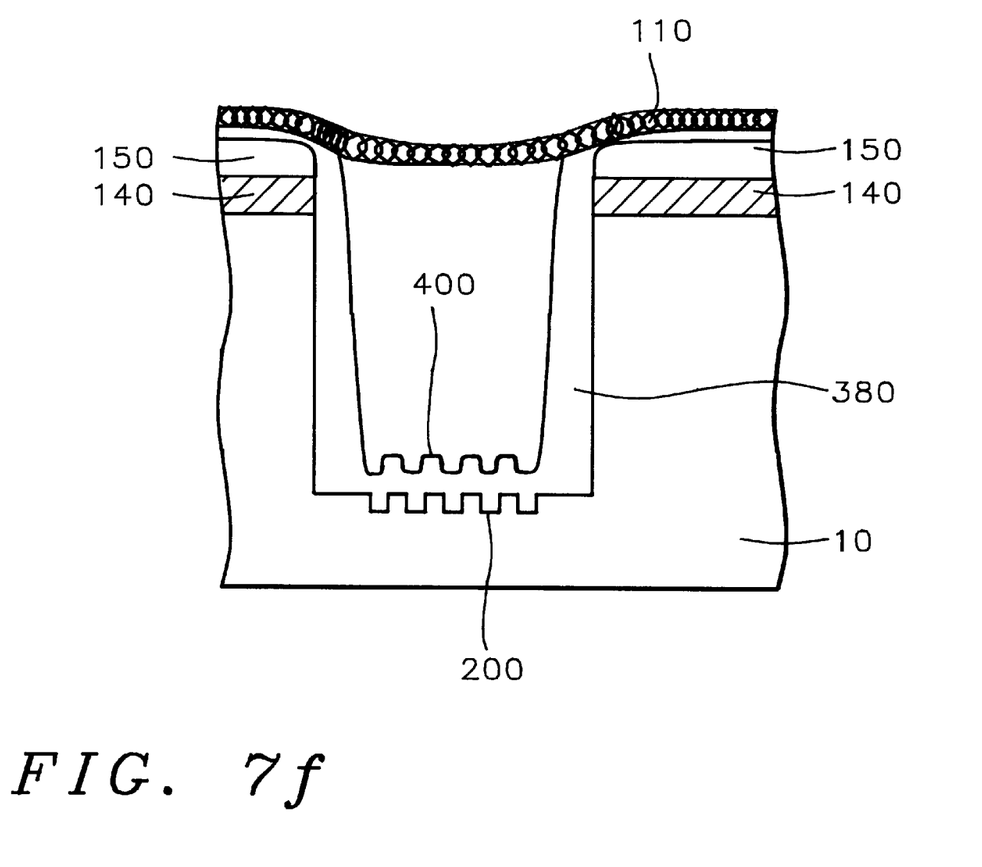

With the preferred aspect ratio given above, and with the preferred location of alignment mark at the perimeter of wafer (100), it has been found that the step height of alignment mark (200) is replicated throughout the remaining wafer fabrication process. Thus, in FIG. 7c, polysilicon conductor (140) is deposited over the wafer. This step usually follows the growing of field isolation regions (not shown) elsewhere on the wafer where integrated circuit devices are formed. After patterning, the polysilicon layer is then covered by the deposition of an interlevel dielectric ILD (150). As seen in FIG. 7c, the step heights of alignment mark (200) are replicated (300) in the ILD (150). In order to planarize the ILD, global planarization technique CMP is used. It will be observed in FIG. 7d that CMP pad (110) "dishes" to some extent at the mouth of the recess, but not sufficient enough to reach down to alignment mark steps (300). Thus alignment is possible for the next step of performing oxide etching, which is shown in FIG. 7e. Next, metal (380) is deposited which replicates the alignment mark. Subsequent CMP polishing with pad (110) does not alter the replicated structure (400) of alignment marks (200).

It is disclosed, therefore, that with a key aspect ratio for the recess for the alignment marks and a key location at the perimeter of wafers, the detrimental effects of CMP polishing can be avoided. Furthermore, it is clear that in the absence of mechanical abrasion, the various layers of conductors and insulators will replicate the step height of the alignment marks repeatably. Alignment marks, formed on the silicon substrate as taught in this invention, therefore, will provide alignment for all layers throughout the manufacture of semiconductor wafers.

While the invention has been particularly shown and described with reference to the preferred embodiments thereof, it will be understood by those skilled in the art that various changes in form and details may be made without departing from the spirit and scope of the invention.

What is claimed is:

1. A method of forming an alignment mark comprising the steps of:

providing a semiconductor substrate;

forming an alignment mark at the outer perimeter of said substrate; and recessing said alignment mark into a recess in said substrate.

2. The method of claim 1, wherein said substrate is silicon.

3. The method of claim 1, wherein said outer perimeter is offset from the edge of said substrate between about 5 to 20 $\mu$m.

4. The method of claim 1, wherein said alignment mark comprises a plurality of grooves.

5. The method of claim 4, wherein said grooves have a step height between about 1,200 to 1,300 Å.

6. The method of claim 4, wherein said lines have a length between about 170 to 180 micrometers ($\mu$m).

7. The method of claim 4, wherein said lines have a width between about 8 to 8.8 $\mu$m.

8. The method of claim 4, wherein said grooves are formed by performing dry plasma etch.

9. The method of claim 8, wherein said plasma etch recipe comprises gas $CF_4$ flowing at a rate between about 50 to 200 standard cubic centimeteres per minute (sccm) and gas $O_2$ at a rate between about 5 to 20 sccm with power between about 200 to 400 watts at a pressure between about 500 to 750 mtorr.

10. The method of claim 1, wherein said recess is formed by performing dry plasma etch.

11. The method of claim 10, wherein said plasma etch recipe comprises gas $SF_6$ flowing at a rate between about 10 to 100 standard cubic centimeteres per minute (sccm) and gas HBr at a rate between about 10 to 100 sccm with power between about 200 to 500 watts at a pressure between about 20 to 100 mtorr.

12. The method of claim 1, wherein said recess has an aspect ratio between about 1/450 to 1/100.

\* \* \* \* \*